(12) United States Patent
Cassidy et al.

(10) Patent No.: US 11,690,300 B2
(45) Date of Patent: Jun. 27, 2023

(54) QUANTUM COMPUTING DEVICES WITH AN INCREASED CHANNEL MOBILITY

(71) Applicant: Microsoft Technology Licensing, LLC, Redmond, WA (US)

(72) Inventors: Maja C. Cassidy, Glebe (AU); Sebastian J. Pauka, Sydney (AU); Cioffi Nicole Allen, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/398,613

(22) Filed: Aug. 10, 2021

(65) Prior Publication Data

US 2023/0146657 A1 May 11, 2023

Related U.S. Application Data

(62) Division of application No. 16/543,422, filed on Aug. 16, 2019, now Pat. No. 11,121,303.

(51) Int. Cl.
*H10N 60/01* (2023.01)
*H01L 29/06* (2006.01)
*H01L 39/24* (2006.01)

(52) U.S. Cl.
CPC .......... *H01L 39/2493* (2013.01); *H01L 29/06* (2013.01)

(58) Field of Classification Search
CPC .......... H01L 39/24–2496; H01L 27/18; H03K 17/92; H03K 19/195
See application file for complete search history.

(56) References Cited

U.S. PATENT DOCUMENTS

2019/0006572 A1 * 1/2019 Falcon ................ H01L 23/5387

* cited by examiner

*Primary Examiner* — Julio J Maldonado
*Assistant Examiner* — Stanetta D Isaac
(74) *Attorney, Agent, or Firm* — Ranjeev Singh; Singh Law, PLLC (57) ABSTRACT

Methods related to the treatment of a quantum computing device to increase channel mobility are described. An example method includes forming a superconducting metal layer on a surface of a wafer. The method further includes selectively removing a portion of the superconducting metal layer to allow a subsequent formation of a gate dielectric associated with the device, where the selectively removing causes a decrease in channel mobility associated with the quantum computing device. The method further includes prior to forming the gate dielectric, subjecting the wafer to a plasma treatment, where a set of parameters associated with the plasma treatment is selected to increase the channel mobility.

20 Claims, 12 Drawing Sheets

QUANTUM COMPUTING DEVICES WITH AN INCREASED CHANNEL MOBILITY

CROSS-REFERENCE TO RELATED APPLICATION(S)

This application is a divisional of U.S. patent application Ser. No. 16/543,422, filed on Aug. 16, 2019, entitled "TREATMENT DURING FABRICATION OF A QUANTUM COMPUTING DEVICE TO INCREASE CHANNEL MOBILITY," the entire contents of which are hereby incorporated herein by reference.

BACKGROUND

Various physical systems have been proposed for building a quantum computer, including trapped ions, nuclear spins, electron spins in semiconductors, photons, and other types of systems. Each of these systems aims to realize a qubit (the quantum equivalent of a bit), which rather than having a value of 0 or a value of 1, is represented by a two-dimensional vector that evolves pursuant to the rules of quantum physics. Topological quantum computing may provide better performance than traditional quantum computing approaches.

SUMMARY

In one example, the present disclosure relates to a method for forming a quantum computing device. The method may include forming a superconducting metal layer on a surface of a wafer. The method may further include selectively removing a portion of the superconducting metal layer to allow a subsequent formation of a gate dielectric associated with the device, where the selectively removing causes a decrease in channel mobility associated with the quantum computing device. The method may further include prior to forming the gate dielectric, subjecting the wafer to a plasma treatment, where a set of parameters associated with the plasma treatment is selected to increase the channel mobility.

In another aspect, the present disclosure relates to a quantum computing device comprising a quantum well formed in a substrate. The quantum computing device may further include a superconducting metal layer formed on a surface of a substrate. The quantum computing device may further include a gate dielectric associated with the quantum computing device formed after selectively removing a portion of the superconducting metal layer, where the selective removal causes a decrease in channel mobility adjacent to the quantum well formed in the substrate, and where the gate dielectric is formed after subjecting the substrate to a plasma treatment, where a set of parameters associated with the plasma treatment is selected to increase the channel mobility adjacent to the quantum well.

In yet another aspect, the present disclosure relates to a method for processing a wafer including a quantum well to form a quantum computing device. The method may include forming a superconducting metal layer on a surface of the wafer. The method may further include selectively removing a portion of the superconducting metal layer to allow a subsequent formation of a gate dielectric associated with the quantum computing device, where the selective removal causes a decrease in channel mobility adjacent to the quantum well. The method may further include prior to forming the gate dielectric, subjecting the wafer to an in-situ plasma treatment with at least hydrogen as a precursor associated with the plasma treatment, where a set of parameters associated with the plasma treatment is selected to increase the channel mobility adjacent to the quantum well such that the channel mobility adjacent to the quantum well is substantially same as an intrinsic channel mobility.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to quantum computing devices and methods of making the same, including treatment during formation of the quantum computing device. Certain examples further relate to topological quantum qubits that may be implemented using 2-dimensional electron gas (2-DEG) structures. Such 2-DEG structures may be formed using materials from group Ill and group V of the periodic table. In addition, such 2-DEG structures may also be formed using materials from group II, group IV, or group VI of the periodic table. These materials may also be used to form vapor-liquid-solid (VLS) nanowires. The VLS nanowires may be formed using chemical beam epitaxy or molecular beam epitaxy and then may be transferred to a substrate to form source, drain, and gate aspects of the devices. In addition, these materials may be used to form topological quantum qubits using selective area growth (SAG) techniques. During the use of any of these techniques to form topological quantum qubits, in the examples described herein, the superconductor formed on the surface couples to the quantum well.

Example devices may be formed using in-situ growth of a superconducting metal, such as aluminum or niobium, on a wafer. Example wafers include wafers formed using any of indium phosphide (InP), indium arsenide (InAs), indium antimonide (InSb), mercury cadmium telluride (HgCdTe), or any appropriate combination of materials selected from groups II, III, IV, V, and VI of the periodic table, or any ternary compounds of three different atoms of materials selected from groups II, III, IV, V, and VI of the periodic table. As an example, the wafers may be formed by epitaxial growth of any of these combination of materials on a substrate. Topological quantum computing devices may be created by forming a metal layer on the wafer that is superconducting. In certain examples, the metal layer may be formed by in-situ growth of the metal or the deposition of the metal on the wafer.

In-situ deposition of a superconductor such as epitaxially grown aluminum directly after the semiconductor growth results in a significant improvement in the quality of the superconducting gap. However, this technique poses additional fabrication challenges. As an example, the aluminum must be removed to define the topological region of the device. Wet etch solutions selective to aluminum are highly exothermic and they cause damage to the semiconductor. This results in increased roughness and induced impurities, reducing the mobility of the 2-dimensional electron gas (2DEG) and compromising the fragile induced p-wave superconducting pairing. Because the length scale over which the hard-gap superconductivity is maintained through a clean interface is set by the height and thickness of the barrier, burying the 2DEG deep in the heterostructure may not be feasible. Accordingly, there is a need for fabrication techniques that repair defects.

Figure 1:
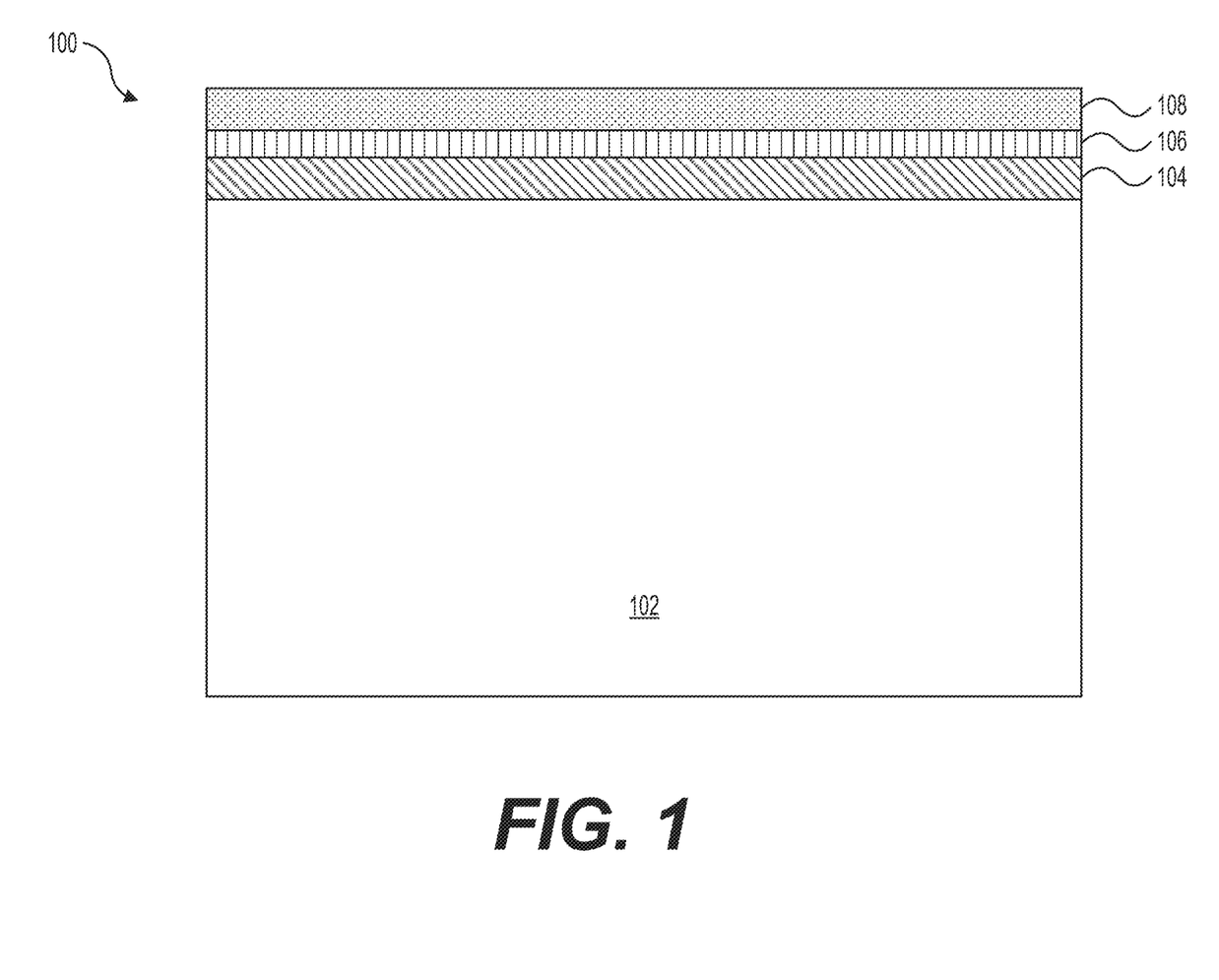
FIG. 1 shows a cross-section view of an example topological quantum computing device during at least one step used to form the device.

FIG. 1 shows a cross-section view of at least one step used in forming a topological quantum computing device 100 in accordance with one example. In this example, as part of this step, starting with a substrate 102, a buffer layer 104 may be formed. Next a quantum well layer 106 may be formed on top of buffer layer 104. Next, another buffer layer 108 may be formed on top of quantum well layer 106 to complete the formation of the heterostructure corresponding to one or more superconducting quantum wells. Buffer layer 108 may not be necessary to complete the formation of certain types of quantum wells. In this example, substrate 102 may be an indium phosphide (InP) substrate. Buffer layer 104 may be an indium gallium arsenide (InGaAs) layer. Quantum well layer 106 may be an indium arsenide (InAs) layer. Buffer layer 108 may be an indium aluminum arsenide (InAlAs) layer. Each of these layers may be formed using molecular-beam epitaxy (MBE). As an example, the MBE related process may be performed in an MBE system that allows the deposition of the appropriate materials in a vacuum. Although FIG. 1 shows a certain number of layers of topological quantum computing device 100 arranged in a certain manner, there could be more or fewer numbers of layers arranged differently.

Figure 2:
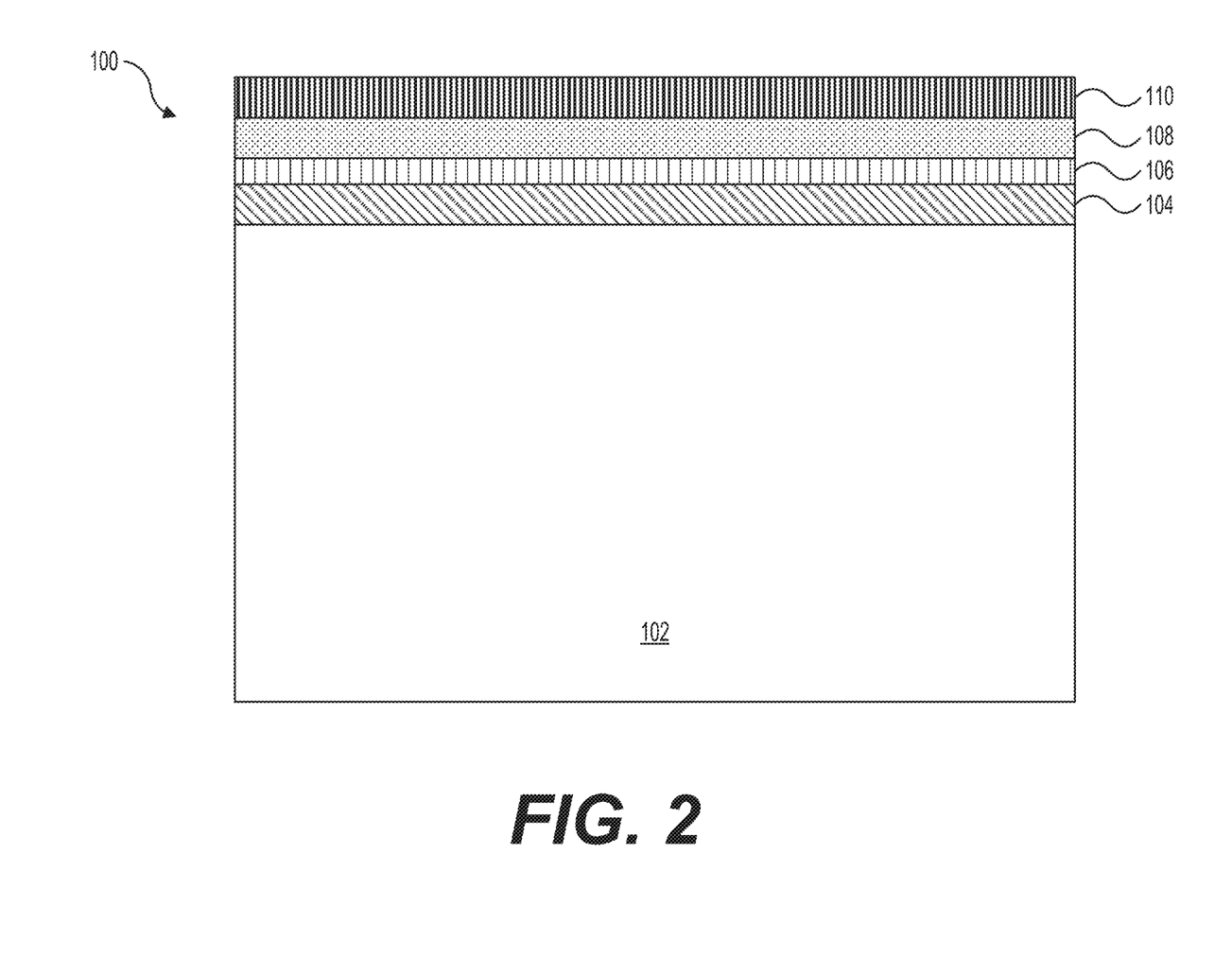
FIG. 2 shows a cross-section view of an example topological quantum computing device during at least one step used to form the device.

FIG. 2 shows a cross-section view of at least one step used in forming a topological quantum computing device 100 in accordance with one example. As part of this step, a metal layer 110 may be formed on top of buffer layer 108. In this example, metal layer 110 may be deposited using MBE, Metal layer 110 may comprise aluminum, niobium, or any other metal that may be superconducting at certain temperatures. Although FIG. 2 shows a certain number of layers of topological quantum computing device 100 arranged in a certain manner, there could be more or fewer numbers of layers arranged differently.

Figure 3:
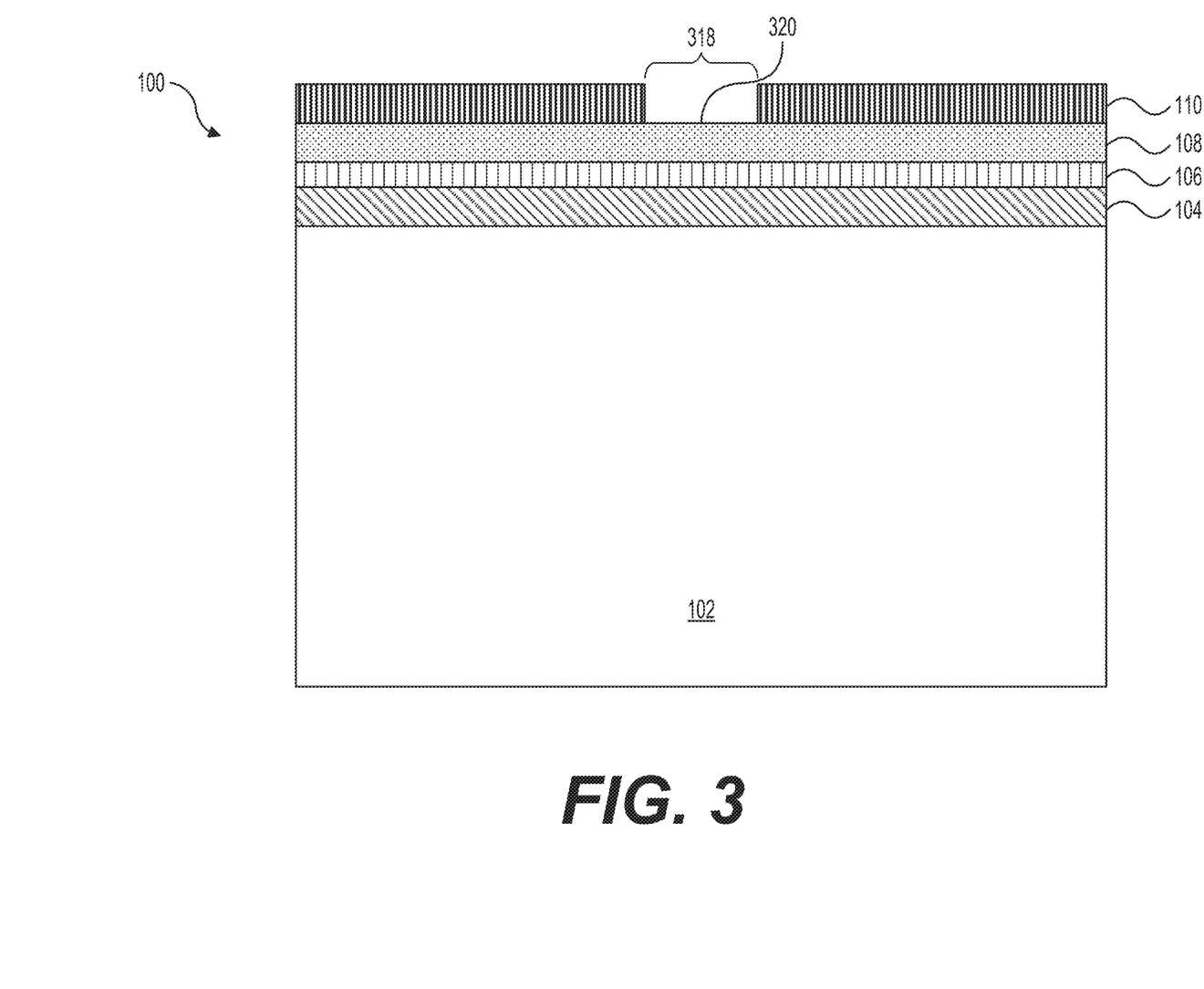
FIG. 3 shows a cross-section view of an example topological quantum computing device during at least one step used to form the device.

FIG. 3 shows a cross-section view of at least one step used in forming a topological quantum computing device 100 in accordance with one example. As part of this step, a portion 318 of metal layer 110 may be selectively removed. This step may be performed using a wet etch or a dry etch. A mask may be used to define the topologically active areas of the topological quantum computing device. The topologically active areas may include quantum wells, e.g., InAs quantum wells or GaAs quantum wells. For topological quantum computing purposes, the interface between the topologically active areas (including a metal layer (e.g., an aluminum layer)) and the topologically inactive areas (not including a metal layer (e.g., an aluminum layer)) is important. The etching step damages a portion of the semiconductor (e.g., portion 320) that is exposed as a result of the etching step, including the interface between the topologically active areas and the topologically inactive areas. Some of this damage corresponds to charged surface states that may interfere with the operation of topological quantum computing device 100. This is because the quantum wells are formed at a shallow depth (e.g., approximately within 10 nm of the surface). The charged surface states may interfere with the quality of the 2DEG. Similarly, other structures, such as nanowires grown using the VLS method, are damaged because there is no buffer layer.

Figure 4:
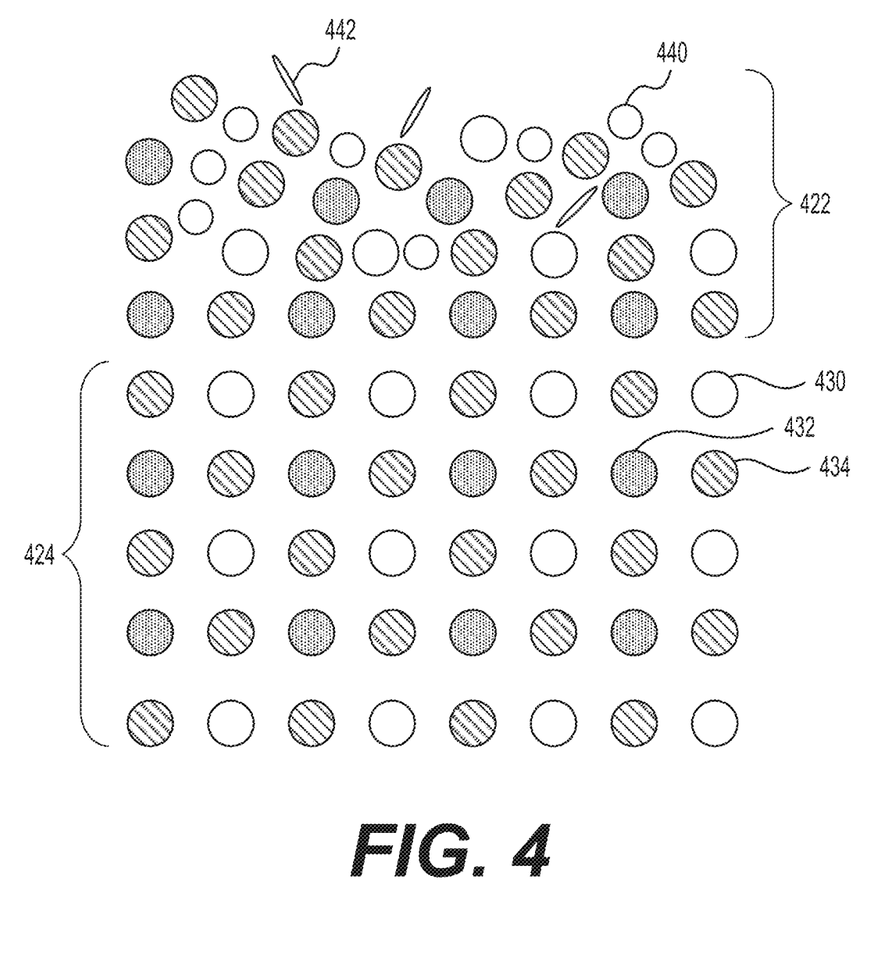
FIG. 4 shows an illustration of the damage to the semiconductor adjacent to the quantum well in accordance with one example.

FIG. 4 shows an illustration of the damage to semiconductor surface 422 adjacent to the quantum well in accordance with one example. The damage to semiconductor surface 422 causes increased roughness and induced impurities, which increases carrier scattering and reduces the mobility of the 2DEG. As shown in the undamaged portion 424, in this example, the quantum well includes atoms corresponding to indium 430, gallium 432, and arsenic 434. If prior to repairing this damage, a dielectric layer (e.g., an oxide layer) were formed, then the oxide layer is likely to contain a large number of charged densities caused by unpaired arsenic atoms and other unbonded positive and negative charges. In addition, the damage to the semiconductor includes other charged surface states, including electrons 442. The damage to the semiconductor further comprises the formation of native oxides, including oxygen atoms 440. In addition, the disruption of the bonds among the elements that comprise the wafer increases the roughness. All of this results in scattering effects which reduce the channel mobility.

To address the damage, two methods to reduce the density of the impurities were tested. The first method included using trimethylaluminum (TMA) precursor to remove the native oxide and thus allow the growth of the abrupt semiconductor/dielectric interfaces with a reduced defect density. The second method included removal of the oxides and the passivation of the charged impurities by a hydrogen plasma. As part of the first method, a 1 second pulse of TMA was applied to the wafer (e.g., the wafer in an atomic layer deposition (ALD) chamber), This was followed by a 30 second purge with nitrogen gas, at a 200 degrees Centigrade process temperature. This pulse cycle was repeated several times (e.g., 18 times) to maximize the reaction, prior to the growth of the dielectric. As part of the testing of the second method, a remotely generated argon-hydrogen (ArH) plasma was applied to the wafer for a total of 120 seconds before the growth of the dielectric layer. Table 1 below shows a listing of samples that were tested. During the testing of these samples, two treatments (TMA reduction and hydrogen passivation) and two oxidizers ($H_2O$ and $O_3$) were evaluated to determine their effect on channel mobility of the samples.

TABLE 1

| Sample | Treatment | Oxide Growth |
| --- | --- | --- |
| A | No treatment | TMA/$H_2O$ |
| B | TMA reduction | TMA/$H_2O$ |
| C | TMA reduction | TMA/$O_3$ |
| D | Hydrogen passivation | TMA/$H_2O$ |
| E | Hydrogen passivation | TMA/$O_3$ |

Figure 5:
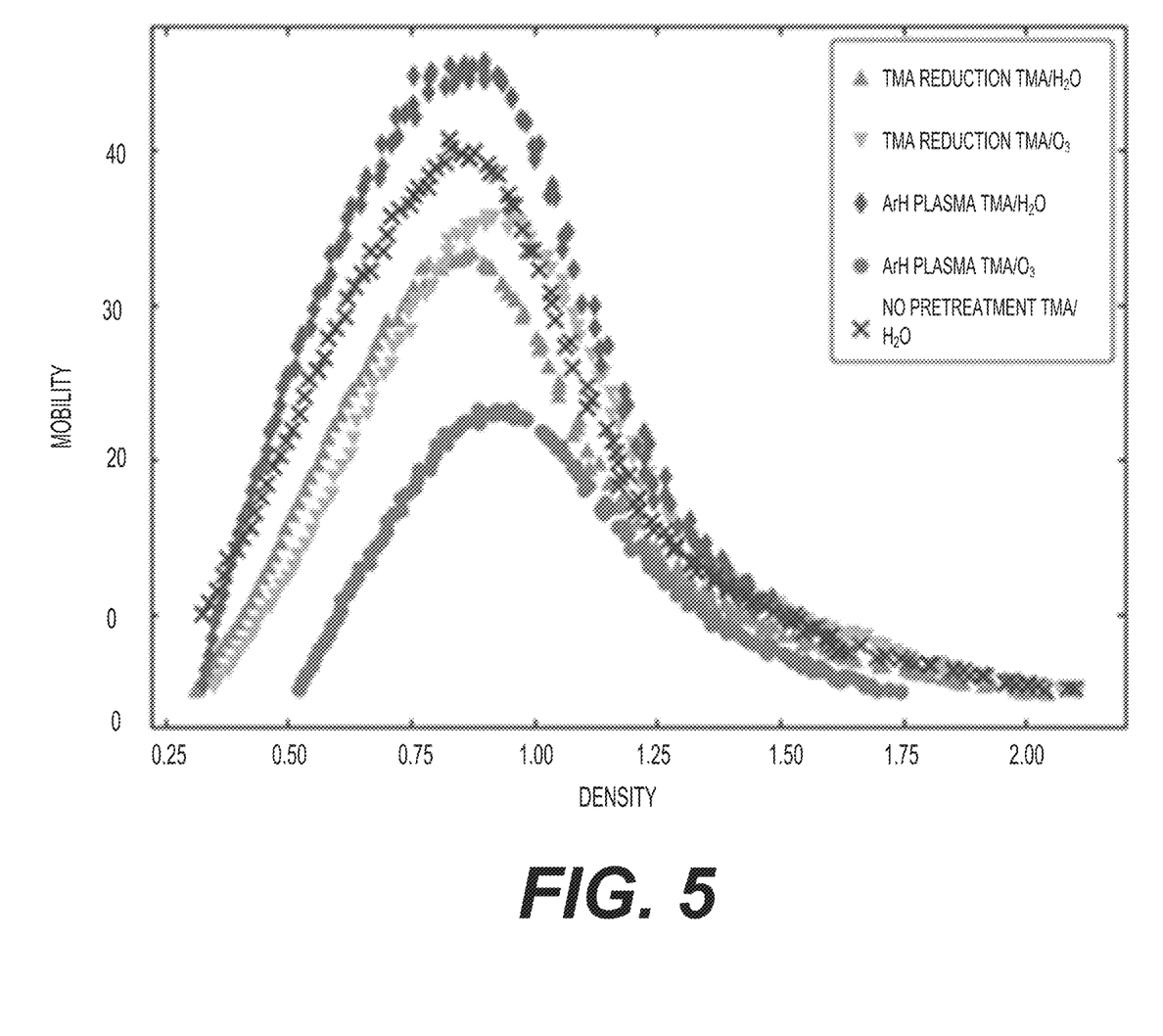
FIG. 5 shows a graph of the mobility versus the density for the tested samples.

For each of the samples, gate voltage was swept, and the mobility and the density values were extracted. FIG. 5 shows representative mobility vs. density traces for each treatment for the five samples (A, B, C, D, and E). The results of this testing showed that the use of the ozone ($O_3$) as a precursor is not effective for the creation of a clean semiconductor-dielectric interface. This is because both ozone treated samples showed a decreased mobility compared with no treatment. As part of the testing performed, the use of the argon and hydrogen (ArH) plasma in combination with oxide growth using TMA and $H_2O$ as an oxidizer was found to be the only treatment to increase the measured mobility relative to the untreated sample. FIG. 5 shows a graph of mobility versus density for the tested samples. The density relates to the density of the electrons within the quantum well. With respect to the topological quantum computing devices that include 2DEGs, for the example tested samples, the density relates to the density of the electrons within the 2DEG. For the example tested samples, the mobility relates to how far the electrons travel before they get scattered or are reflected.

Figure 6:
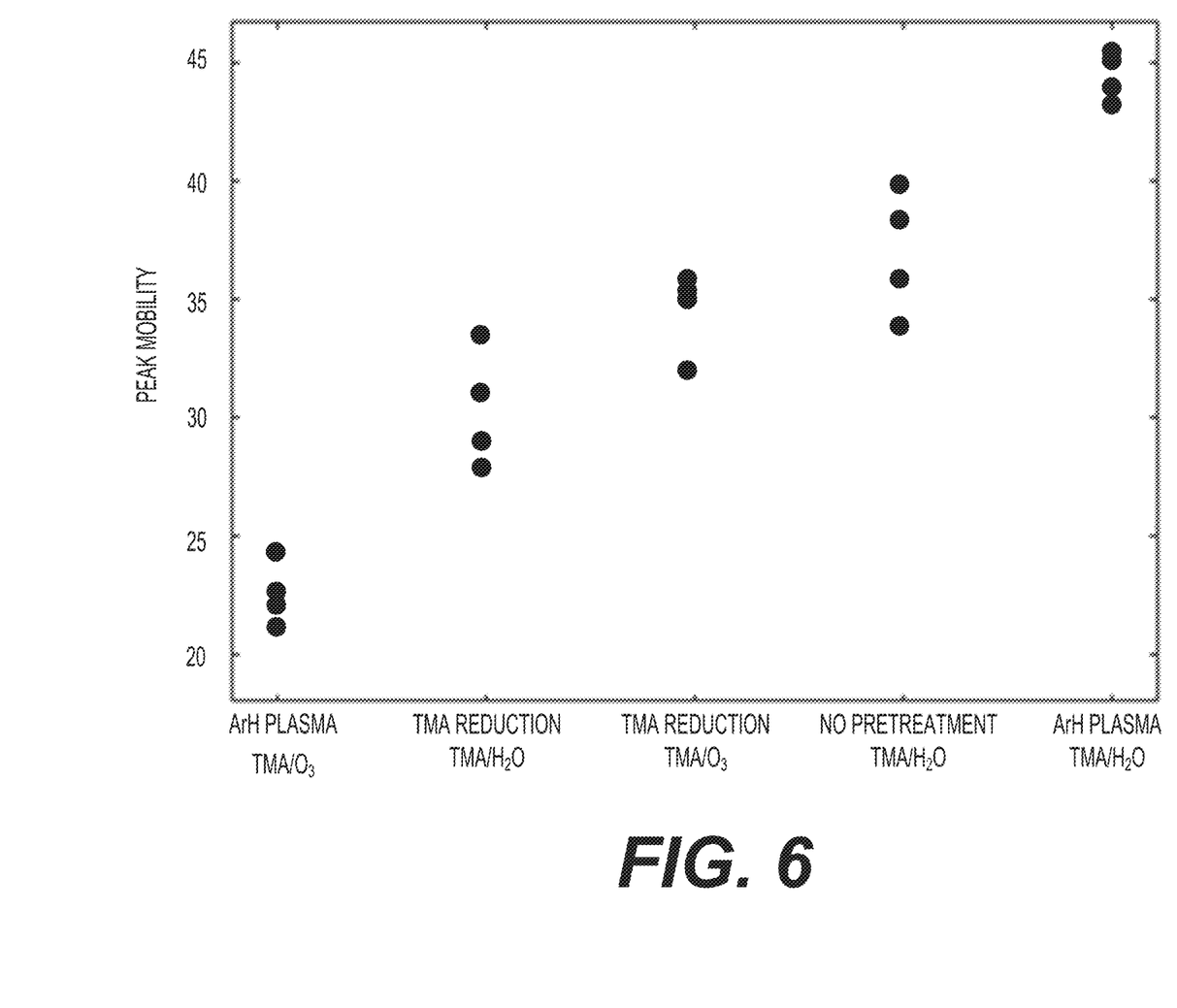
FIG. 6 shows the peak mobility achieved for the various treatments.
Figure 7:
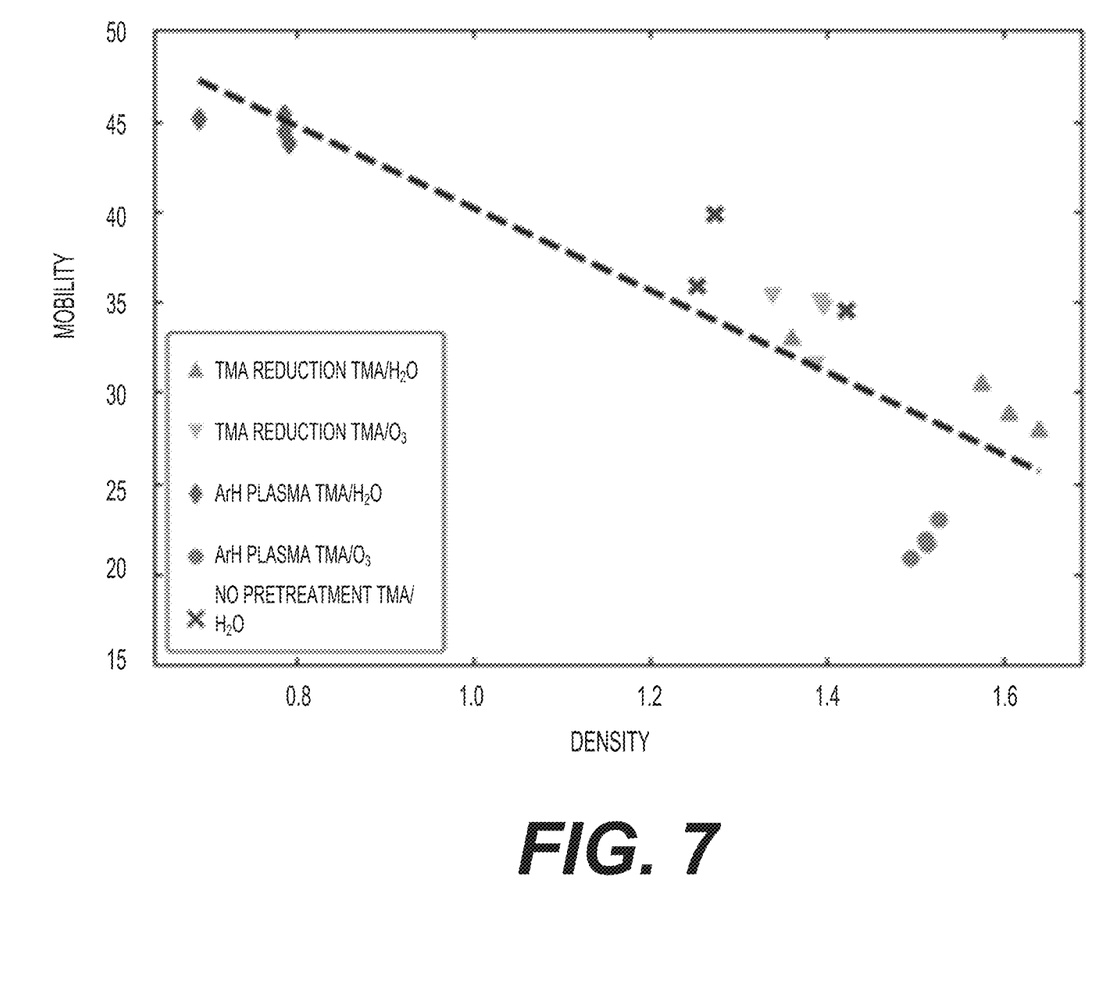
FIG. 7 shows the peak mobility versus density at zero gate voltage for the various treatments.

FIG. 6 shows the peak mobility achieved for the various treatments. FIG. 7 shows the peak mobility versus density at zero gate voltage ($V_{TG}$). As shown from these results, there is an improvement in the channel mobility adjacent to heterostructures, including quantum wells, relative to the channel mobility an untreated sample. Although the tests show results related to hydrogen plasma, other plasma precursors may also be used. As an example, instead of a hydrogen plasma, a helium plasma or a nitrogen plasma may be used. In addition, although the tests show results related to the trimethylaluminum (TMA) precursor, other atomic layer deposition precursors, such as tetrakisdimethylamidohafnium may also be used.

Thus, in examples consistent with the present disclosure, the wafer is subjected to a plasma treatment in which the parameters associated with the plasma treatment are selected to increase the channel mobility adjacent to the quantum well. In this example, the plasma treatment is provided using a remote plasma source; thus, the wafer is not subjected to a direct plasma. The parameters associated with the plasma treatment include any precursors associated with the plasma treatment, a density of any ions or electrons associated with the plasma treatment, and a type of power source associated with the plasma treatment. In one example, the precursors include argon and hydrogen. The power source may be a direct current (DC) power source, a pulsed-DC power source; or a radio frequency (RF) power source.

Figure 8:
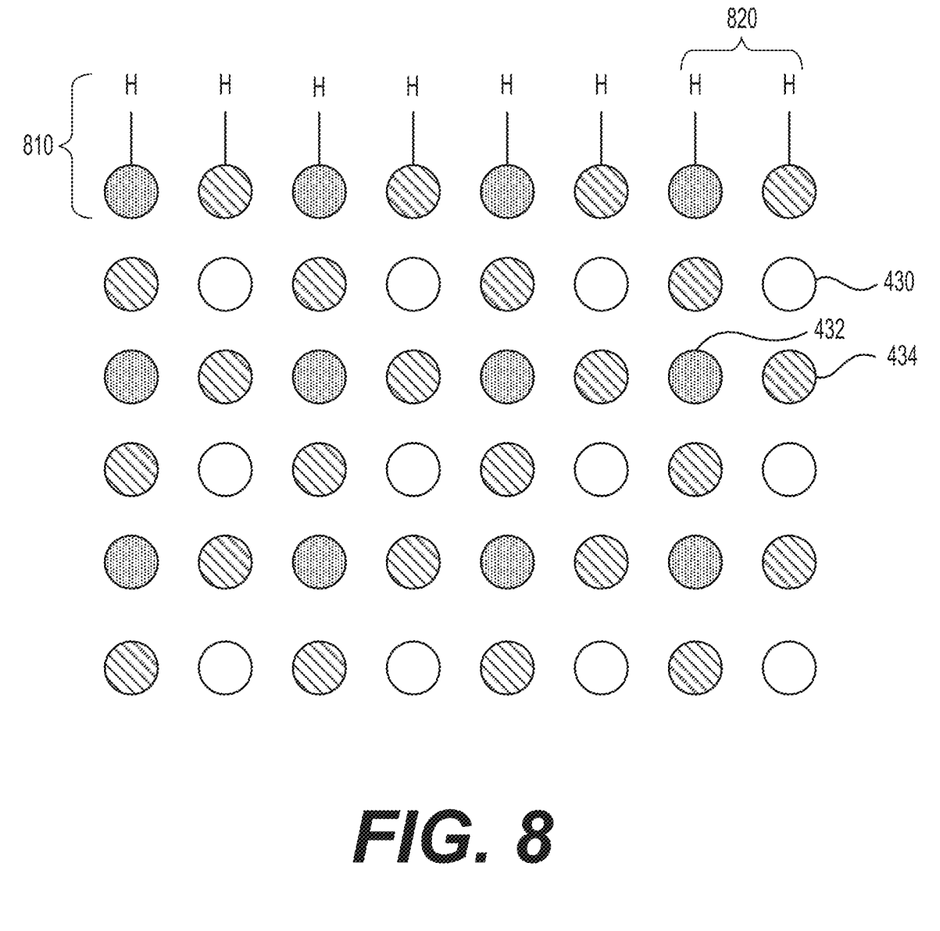
FIG. 8 shows an illustration of the changes to the semiconductor as a result of the plasma treatment.
Figure 9:
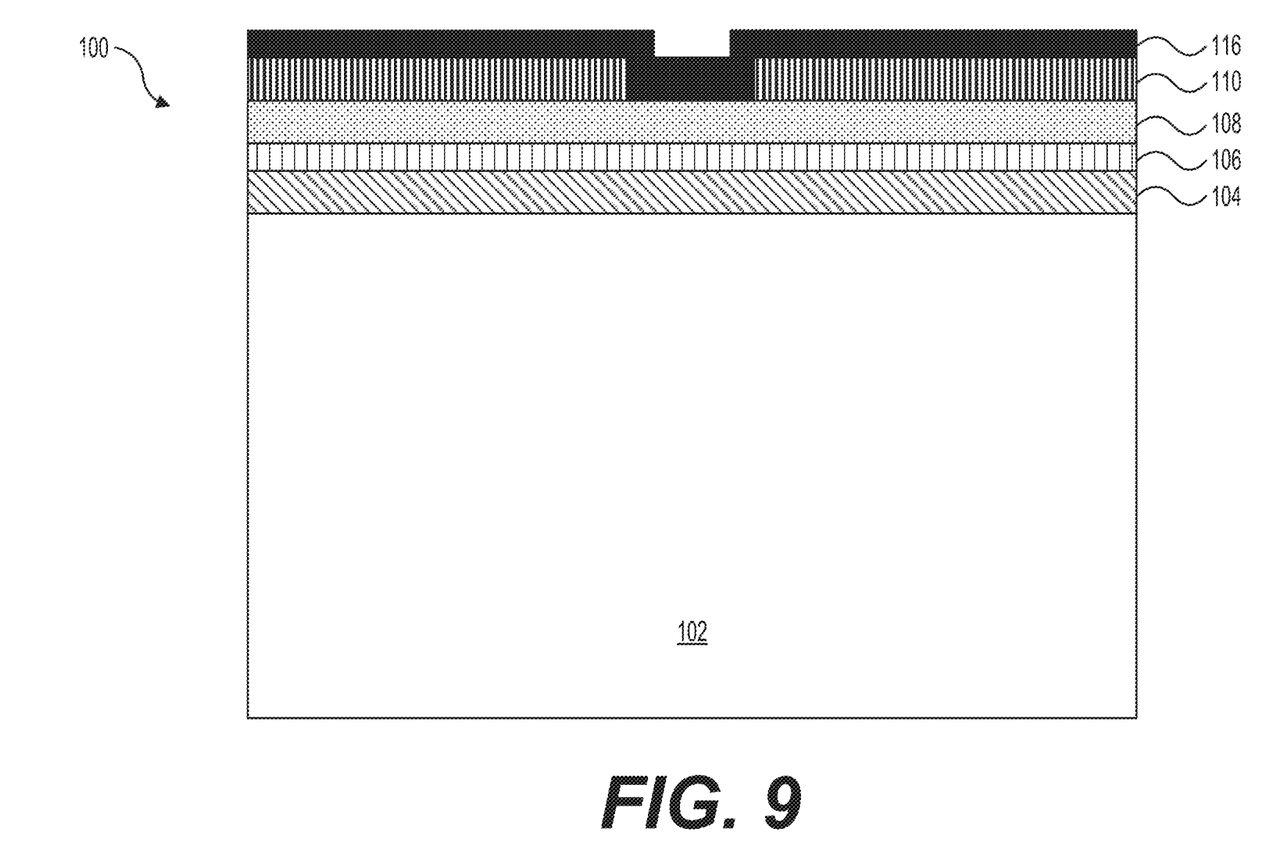
FIG. 9 shows a cross-section view of an example topological quantum computing device during at least one step used to form the device.

FIG. 8 shows an illustration of the changes to semiconductor 810 as a result of the plasma treatment. Atomic hydrogen 820 bonds to the arsenic (As) atoms (e.g., 430) to partially saturate the dangling bonds to passivate the wafer. The hydrogen plasma also selectively removes the oxides via dry etching, again leading to an abrupt semiconductor-dielectric interface. These techniques significantly increase mobility, which is a key requirement for topological materials, and reduce the variance in the mobility between multiple samples compared to alternate treatments or without any treatment. In addition, as described earlier, these techniques are not only applicable to InAs 2DEGs, but also to VLS wires, SAG materials, or any other devices made from any semiconductor materials selected from group III-V of the periodic table, FIG. 9 shows a cross-section view of at least one step used in forming a topological quantum computing device 100 in accordance with one example. As part of this step a dielectric layer 116 is formed. In this example, dielectric layer 116 is formed using atomic layer deposition. Dielectric layer 116 may comprise aluminum oxide (e.g., $Al_2O_3$). Although FIG. 9 shows a certain number of layers of topological quantum computing device 100 arranged in a certain manner, there could be more or fewer numbers of layers arranged differently.

Figure 10:
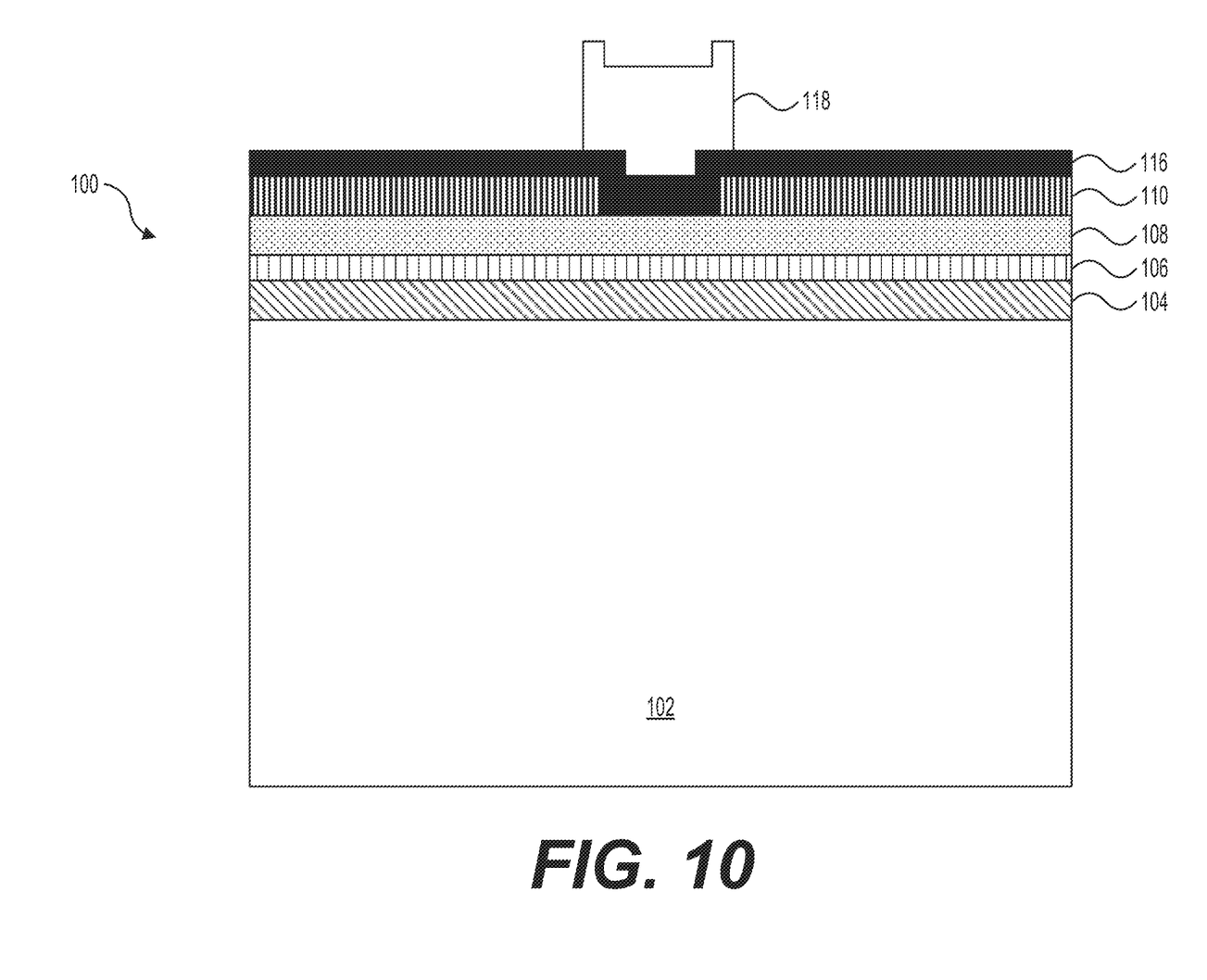
FIG. 10 shows a cross-section view of an example topological quantum computing device during at least one step used to form the device.

FIG. 10 shows a cross-section view of at least one step used in forming a topological quantum computing device 100 in accordance with one example. This step includes forming a gate 118 (e.g., a metal gate) for controlling the channel between the source and the drain associated with a switching component associated with topological computing device 100. In one example, gate 118 may be a titanium gold (Ti—Au) gate. Although FIG. 10 shows a certain number of layers of topological quantum computing device 100 arranged in a certain manner, there could be more or fewer numbers of layers arranged differently.

Figure 11:
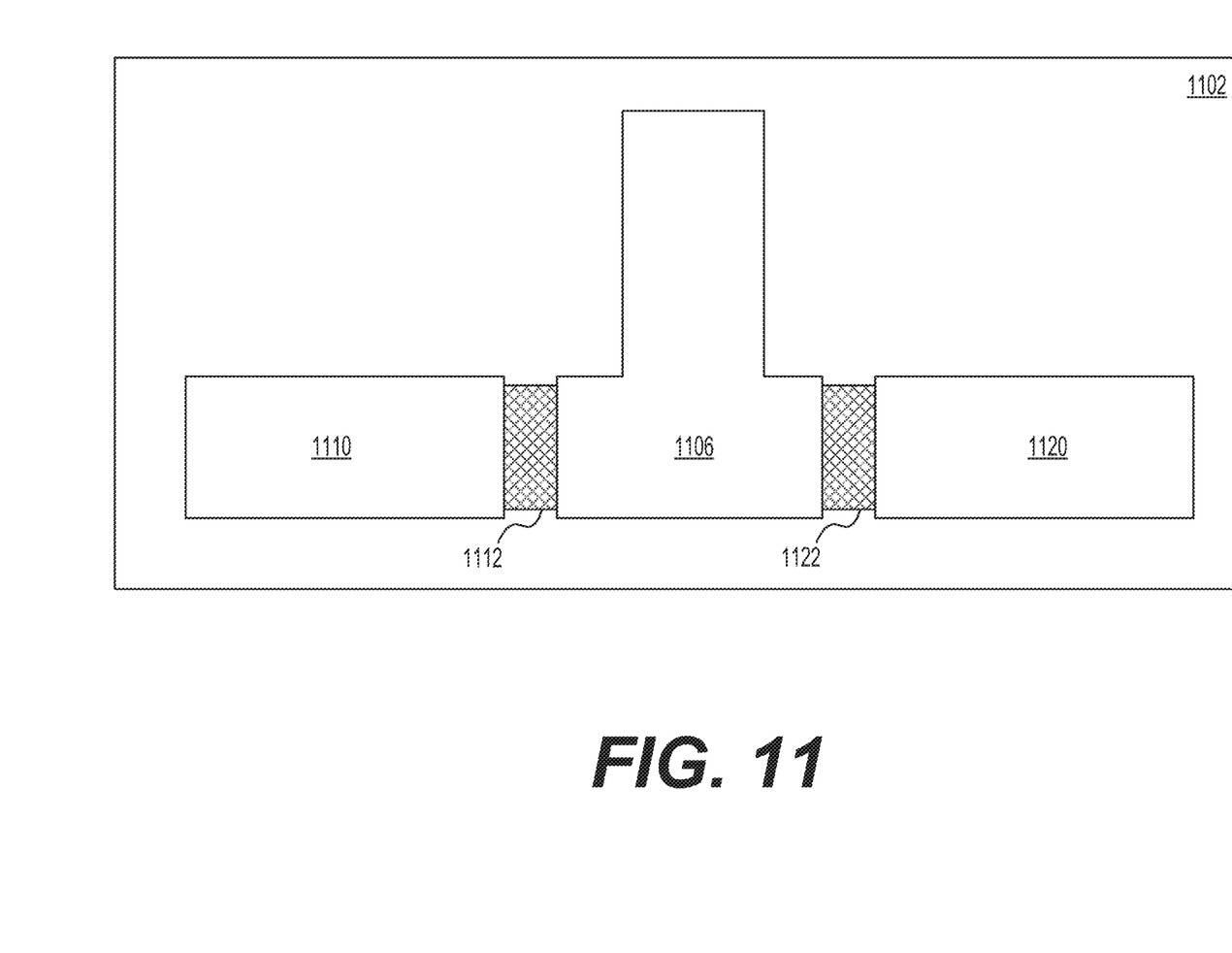
FIG. 11 shows a top view of an example topological quantum computing device during at least one step used to form the device.

FIG. 11 shows a top view of an example topological quantum computing device 100 during at least one step used to form the device. In this example, topological quantum computing device 100 includes a source 1110, a drain 1120 and a gate 1106. Gate 1106 may correspond to gate 118 of FIG. 10. The top view also shows dielectric layer 1102, which may correspond to layer 116 shown in FIG. 9. Topological quantum computing device 100 may further includes a channel 1112 between source 1110 and gate 1106 and another channel between drain 1120 and gate 1106. The process steps described earlier, including the treatment, helps increase the mobility of each of channels 1112 and 1122. Although FIG. 11 shows a planar arrangement of the source, drain, and the gate, these may be arranged in a non-planar arrangement. As an example, gate 1106 may be a vertical fin-type gate. In addition, although FIG. 11 shows only one gate, one source, and one drain, topological quantum computing device may include a plurality of gates, sources, or drains.

Figure 12:
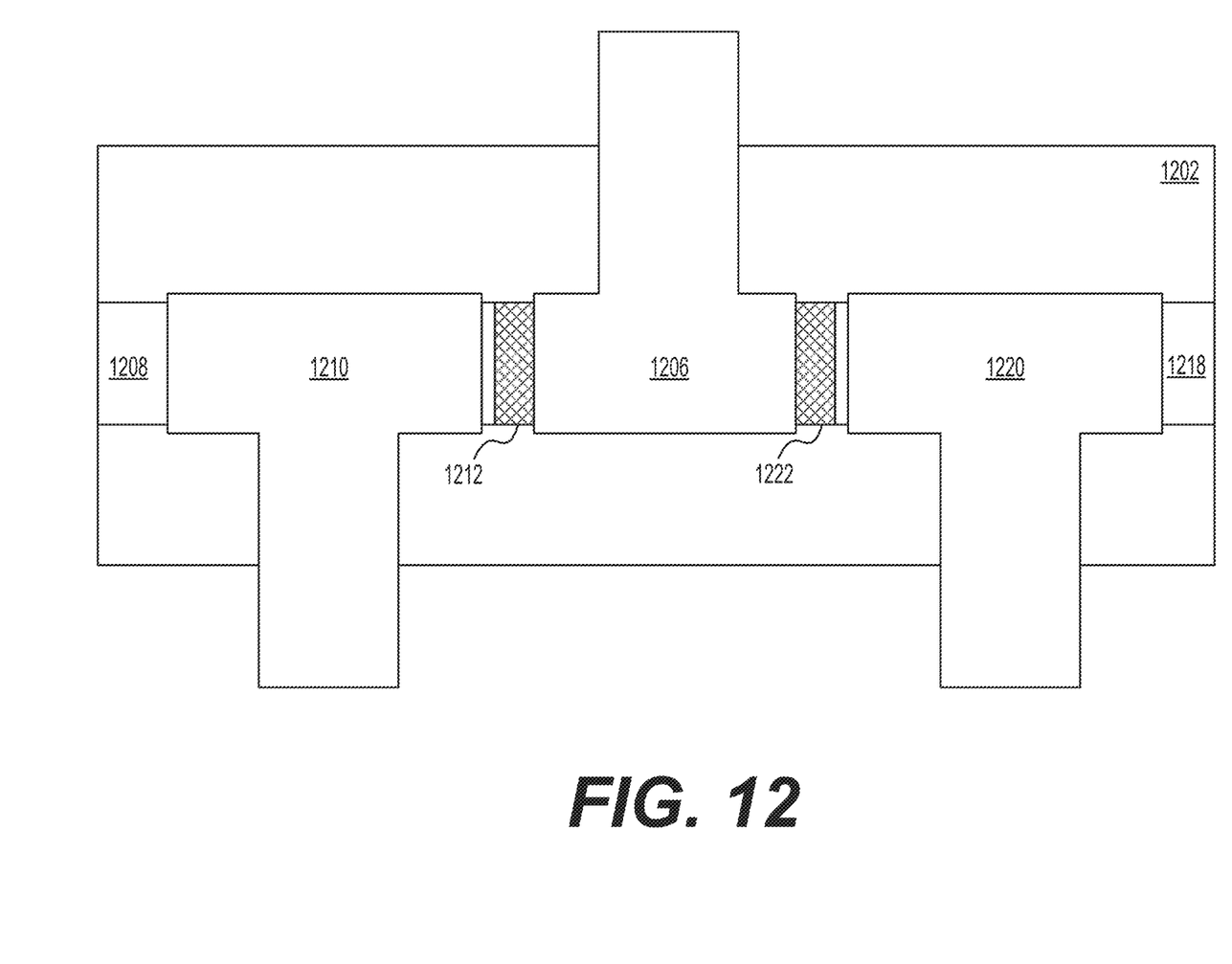
FIG. 12 shows a top view of an example topological quantum computing device during at least one step used to form the device.

FIG. 12 shows a top view of an example topological quantum computing device 100 during at least one step used to form the device. In this example, topological quantum computing device 100 includes a source 1208, a drain 1218, a gate 1206, another gate 1210, and a yet another gate 1220. Gate 1206 may correspond to gate 118 of FIG. 10. Gates 1210 and 1220 may allow additional control of topological quantum computing device 100. The top view also shows dielectric layer 1202, which may correspond to layer 116 shown in FIG. 9. Topological quantum computing device 100 may further include a channel 1212 between source 1208 and gate 1206 and another channel 1222 between drain 1218 and gate 1206. The process steps described earlier, including the treatment, helps increase the mobility of each of channels 1212 and 1222. Although FIG. 12 shows a planar arrangement of the source, drain, and the various gates, these may be arranged in a non-planar arrangement. As an example, gate 1206 may be a vertical fin-type gate.

In conclusion, the present disclosure relates to a method for forming a quantum computing device. The method may include forming a superconducting metal layer on a surface of a wafer. The method may further include selectively removing a portion of the superconducting metal layer to allow a subsequent formation of a gate dielectric associated with the device, where the selectively removing causes a decrease in channel mobility associated with the quantum computing device. The method may further include prior to forming the gate dielectric, subjecting the wafer to a plasma treatment, where a set of parameters associated with the plasma treatment is selected to increase the channel mobility.

The set of parameters may include parameters of any precursors associated with the plasma treatment, a density of any ions or electrons associated with the plasma treatment, a type of power source associated with the plasma treatment. The precursors associated with the plasma treatment may comprise argon and hydrogen.

The quantum well may correspond to a topologically active area associated with the quantum computing device. The plasma treatment may comprise a remote plasma treatment. The remote plasma treatment may be provided using a power source selected from a group comprising a direct current (DC) power source, a pulsed-DC power source, or a radio frequency (RF) power source.

The method may further include prior to subjecting the wafer to the plasma treatment, applying trimethylaluminum to the surface of the wafer in an atomic layer deposition chamber. The precursors associated with the plasma treatment may also comprise helium. The topological quantum computing device may comprise at least one of a 2-dimensional electron gas (2DEG), a vapor-liquid-solid (VLS) nanowire, or a structure formed using selective area growth.

In another aspect, the present disclosure relates to a quantum computing device comprising a quantum well formed in a substrate. The quantum computing device may further include a superconducting metal layer formed on a surface of a substrate. The quantum computing device may further include a gate dielectric associated with the quantum computing device formed after selectively removing a portion of the superconducting metal layer, where the selective removal causes a decrease in channel mobility adjacent to the quantum well formed in the substrate, and where the gate dielectric is formed after subjecting the substrate to a plasma treatment, where a set of parameters associated with the plasma treatment is selected to increase the channel mobility adjacent to the quantum well. The set of parameters may include parameters of any precursors associated with the plasma treatment, a density of any ions or electrons associated with the plasma treatment, a type of power source associated with the plasma treatment. The precursors associated with the plasma treatment may comprise argon and hydrogen.

The plasma treatment may comprise a remote plasma treatment. The remote plasma treatment may be provided using a power source selected from a group comprising a direct current (DC) power source, a pulsed-DC power source, or a radio frequency (RF) power source.

In yet another aspect, the present disclosure relates to a method for processing a wafer including a quantum well to form a quantum computing device. The method may include forming a superconducting metal layer on a surface of the wafer. The method may further include selectively removing a portion of the superconducting metal layer to allow a subsequent formation of a gate dielectric associated with the quantum computing device, where the selective removal causes a decrease in channel mobility adjacent to the quantum well. The method may further include prior to forming the gate dielectric, subjecting the wafer to an in-situ plasma treatment with at least hydrogen as a precursor associated with the plasma treatment, where a set of parameters associated with the plasma treatment is selected to increase the channel mobility adjacent to the quantum well such that the channel mobility adjacent to the quantum well is substantially same as an intrinsic channel mobility.

The set of parameters may include a density of any ions or electrons associated with the plasma treatment and a type of power source associated with the plasma treatment. An additional precursor associated with the plasma treatment may further comprise argon.

The plasma treatment may comprise a remote plasma treatment. The remote plasma treatment ray be provided using a power source selected from a group comprising a direct current (DC) power source, a pulsed-DC power source, or a radio frequency (RF) power source. The method may further include prior to subjecting the wafer to the in-situ plasma treatment, applying trimethylaluminum to the surface of wafer in an atomic layer deposition chamber.

It is to be understood that the methods, modules, and components depicted herein are merely exemplary. For example, and without limitation, illustrative types of devices may include quantum computing devices, semiconductor devices, topological quantum computing devices, etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A topological quantum computing device comprising:
a quantum well formed in a substrate;
a superconducting metal layer formed on a surface of the substrate; and
a gate dielectric formed over the superconducting metal layer after selectively removing a portion of the superconducting metal layer to define a topologically active area of the topological quantum computing device, wherein the gate dielectric is formed after subjecting the substrate to a plasma treatment, wherein a set of parameters associated with the plasma treatment is selected to both increase channel mobility of a channel adjacent to the quantum well associated with the topological quantum computing device and increase a density of electrons within the quantum well, and wherein the plasma treatment further results in a formation of a clean semiconductor-dielectric interface between the topologically active area of the topological quantum computing device and a topologically inactive area of the topological quantum computing device.

2. The quantum computing device of claim 1, wherein the set of parameters includes parameters of any precursors associated with the plasma treatment, a density of any ions or electrons associated with the plasma treatment, or a type of power source associated with the plasma treatment.

3. The quantum computing device of claim 2, wherein the precursors associated with the plasma treatment comprise argon and hydrogen.

4. The quantum computing device of claim 1, wherein the plasma treatment comprises a remote plasma treatment.

5. The quantum computing device of claim 4, wherein the remote plasma treatment is provided using a power source selected from a group comprising a direct current (DC) power source, a pulsed-DC power source, or a radio frequency (RF) power source.

6. The quantum computing device of claim 1, wherein the quantum computing device comprises at least one of a 2-dimensional electron gas (2DEG), a vapor-liquid-solid (VLS) nanowire, or a structure formed using selective area growth.

7. A topological quantum computing device comprising:
a topologically active area formed in a substrate by selectively removing a portion of a superconducting metal layer formed over a semiconductor layer, wherein a removal of the portion of the superconducting metal layer exposes a portion of the semiconductor layer to form an exposed portion; and
a gate, formed over the exposed portion of the semiconductor layer, wherein the gate comprises a gate dielectric formed over at least the exposed portion of the semiconductor layer, wherein the gate dielectric is formed after subjecting the substrate to a plasma treatment, wherein a set of parameters associated with the plasma treatment is selected to both increase channel mobility of a channel adjacent to the topologically active area and increase a density of electrons within the topologically active area, and wherein the plasma treatment further results in a formation of a clean semiconductor-dielectric interface between the topologically active area and a topologically inactive area of the topological quantum computing device.

8. The quantum computing device of claim 7, wherein the gate is configured to control an operational aspect associated with the quantum computing device.

9. The quantum computing device of claim 7, wherein the topologically active area comprises a quantum well.

10. The quantum computing device of claim 7, wherein the quantum computing device comprises at least one of a 2-dimensional electron gas (2DEG), a vapor-liquid-solid (VLS) nanowire, or a structure formed using selective area growth.

11. The quantum computing device of claim 7, wherein the set of parameters includes parameters of any precursors associated with the plasma treatment, a density of any ions or electrons associated with the plasma treatment, or a type of power source associated with the plasma treatment.

12. The quantum computing device of claim 11, wherein the precursors associated with the plasma treatment comprise argon and hydrogen.

13. The quantum computing device of claim 11, wherein the plasma treatment comprises a remote plasma treatment.

14. The quantum computing device of claim 13, wherein the remote plasma treatment is provided using a power source selected from a group comprising a direct current (DC) power source, a pulsed-DC power source, or a radio frequency (RF) power source.

15. A topological quantum computing device comprising:
a quantum well formed in a substrate by selectively removing a portion of a superconducting metal layer formed over a semiconductor layer, wherein a removal of the portion of the superconducting metal layer exposes a portion of the semiconductor layer to form an exposed portion; and
a gate, formed over the exposed portion of the semiconductor layer, wherein the gate comprises a gate dielectric formed over at least the exposed portion of the semiconductor layer, wherein the gate dielectric is formed after subjecting the substrate to a plasma treatment, wherein a set of parameters associated with the plasma treatment is selected to both increase channel mobility of a channel adjacent to the quantum well and increase a density of electrons within the quantum well, and wherein the plasma treatment further results in a formation of a clean semiconductor-dielectric interface between the quantum well and a topologically inactive area of the topological quantum computing device.

16. The quantum computing device of claim 15, wherein the gate is configured to control an operational aspect associated with the quantum computing device.

17. The quantum computing device of claim 15, wherein the set of parameters include parameters of any precursors associated with the plasma treatment, a density of any ions or electrons associated with the plasma treatment, or a type of power source associated with the plasma treatment.

18. The quantum computing device of claim 17, wherein the precursors associated with the plasma treatment comprise argon and hydrogen.

19. The quantum computing device of claim 15, wherein the substrate comprises one or more of indium phosphide (InP), indium arsenide (InAs), indium antimonide (InSb), or mercury cadmium telluride (HgCdTe).

20. The quantum computing device of claim 15, wherein the superconducting metal layer comprises one of aluminum or niobium.

\* \* \* \* \*